(12) United States Patent
O'Higgins et al.

(10) Patent No.: US 8,612,916 B1
(45) Date of Patent: Dec. 17, 2013

(54) SYSTEM AND METHOD FOR IMPORT AND EXPORT OF DESIGN CONSTRAINTS

(71) Applicant: Xilinx, Inc., San Jose, CA (US)

(72) Inventors: Brendan M. O'Higgins, Sunnyvale, CA (US); Pradip K. Jha, Cupertino, CA (US); Dinesh K. Monga, Santa Clara, CA (US); David A. Knol, Morgan Hill, CA (US)

(73) Assignee: Xilinx, Inc., San Jose, CA (US)

( * ) Notice: Subject to any disclaimer, the term of this patent is extended or adjusted under 35 U.S.C. 154(b) by 0 days.

(21) Appl. No.: 13/709,733

(22) Filed: Dec. 10, 2012

(51) Int. Cl.
 *G06F 17/50* (2006.01)
(52) U.S. Cl.
 USPC .......................... 716/122; 716/103
(58) Field of Classification Search
 USPC .................................. 716/103, 122
 See application file for complete search history.

(56) References Cited

U.S. PATENT DOCUMENTS

| | | | | |
|---|---|---|---|---|
| 2008/0282212 | A1* | 11/2008 | Dennison et al. | 716/10 |
| 2009/0287837 | A1* | 11/2009 | Felsher | 709/229 |
| 2011/0231807 | A1* | 9/2011 | Sato | 716/122 |

* cited by examiner

*Primary Examiner* — Jack Chiang
*Assistant Examiner* — Mohammed Alam
(74) *Attorney, Agent, or Firm* — LeRoy D. Maunu; Lois D. Cartier

(57) ABSTRACT

A method is provided for exporting design constraints from a circuit design. In response to a first user command indicating a design constraint and a pattern, the design constraint is assigned to each object in the circuit design that matches the pattern, and the pattern is stored in a database. In response to a second user command to export design constraints of the circuit design, for each design constraint assigned to a respective set of objects of the circuit design, a pattern stored in the database that matches the respective set of the objects is determined and the design constraint is added to an export file in a format that uses the determined pattern. Design constraints on individual ones of the set of the objects indicated by the determined pattern are omitted from the export file.

20 Claims, 5 Drawing Sheets

SYSTEM AND METHOD FOR IMPORT AND EXPORT OF DESIGN CONSTRAINTS

TECHNICAL FIELD

The disclosure generally relates to input/output (I/O) interfaces, and more particularly to the import and export of design constraints associated with the I/O interfaces.

BACKGROUND

Programmable integrated circuits (ICs) are often used to implement digital logic operations according to user configurable input. Example programmable ICs include complex programmable logic devices (CPLDs) and field programmable gate arrays (FPGAs). CPLDs often include several function blocks that are based on a programmable logic array (PLA) architecture with sum-of-products logic. A configurable interconnect matrix transmits signals between the function blocks.

An example FPGA includes an array of configurable logic blocks (CLBs) and a ring or columns of programmable input/output blocks (IOBs). The CLBs and IOBs are interconnected by a programmable interconnect structure (routing resources). The CLBs, IOBs, and interconnect structure are typically programmed by loading configuration data ("configuration bitstream") into internal configuration memory cells. The state of the configuration memory cells determines the function of the CLBs, IOBs, and interconnect structure. The configuration bitstream may be read from an external memory, such as an EEPROM, EPROM, PROM and the like, though other types of memory may be used.

A typical design process begins with the creation of a circuit design. The circuit design specifies the function of a circuit at a schematic or logic level and may be represented using various hardware description languages (e.g., VHDL, ABEL, or Verilog) or schematic capture programs. The design is synthesized to produce a logical network list ("netlist"), and the synthesized design is mapped onto primitive components within the target device (e.g., programmable logic blocks of an FPGA).

Following mapping, placement of the components of the synthesized and mapped design is performed for the target device. During placement, each mapped component of the design is assigned to a physical position on the device. The placer attempts to place connected design objects in close physical proximity to one another in order to conserve space and increase the probability that the required interconnections between components will be successfully completed by the router. Placing connected components close to one another also generally improves the performance of the circuit since long interconnect paths are associated with excess capacitance and resistance, resulting in longer delays and greater power consumption. The timing and resource requirements of a circuit are specified as design constraints in a design constraints language. The circuits are placed and routed using the design constraints to ensure that requirements specified by the design constraints are satisfied in the placed and routed design. Design constraints may be applied to various objects of a circuit design (e.g., cell instances, nets, etc) to indicate various parameters to be applied during placement and routing of the objects. For ease of reference, the value of a parameter indicated by a constraint may be referred to as a constraint value. When a design constraint is applied to one or more objects of a circuit design, the design constraint is stored and associated with each of the one or more objects. When the circuit design is placed and routed, the stored design constraint is retrieved and used to direct placement and routing of the one or more objects to satisfy the design constraint.

Design constraints may be input as command line input, entries in source files, or through a graphical user interface. Design constraints may have different formats depending on the design tool that is used for placement and routing. In some implementations, design constraints may be formatted as entries that indicate placement and routing parameters and sets of objects to which each parameter is to be applied. In some other implementations, design constraints may be formatted as executable instructions that cause the design tool to set parameters of objects indicated by the executable command. Moreover, an input design constraint may include a pattern that identifies several objects to which a constraint is to be applied. For instance, a pattern may be used with a get_cells command to retrieve all cells of a circuit design that match the pattern. For example, the wildcard character "*" matches any sequence of characters, and the character "?" matches any single character. A syntax known as regular expressions can also be used to match the names of many objects. Another example of a pattern is the option -filter {direction==input}, which may be used with a get_cells command to exclude certain cells matching a pattern from a retrieved set. In fact, a pattern may be a combination of -filter options and wildcard expressions or regular expressions. For example, add_cells_to_pblock pblock_1 [get_cells ABC*]

creates a constraint for pblock_1 for each of the cells of a circuit design that match the pattern "ABC*". For instance, if the design contains 1000 cells with the names ABC1, ABC2, ABC3, . . . ABC1000, then this single command creates 1000 constraints.

In many development situations, it may be desirable to export design constraints that have been applied to objects of a circuit design. For example, during development it may be desirable to save a list of design constraints applied to a circuit design for use as a restore point. As another example, a circuit developed by one development team may be incorporated as a sub-circuit cell in a larger circuit design. However, such development must be properly coordinated between the teams so that all of the sub-circuit cells are placed and routed to meet various requirements of the respective sub-circuits such as timing requirements, resource requirements, etc. In incorporating the circuit into the larger design, design constraints applied to the circuit to be incorporated should also be applied in the larger design to ensure that the circuit operates under its expected parameters.

In one approach, software is used to expand all the patterns to create individual constraints for each cell of the circuit design that matches a pattern. The individual constraints may be directly exported and saved to a constraints file. However, this approach can increase the size of the constraints file by many times. Such a large file may be inconvenient for the user to examine and edit. Further, the file may take a long time for the software to read and interpret. Moreover, users generally prefer to see constraints specified in a similar syntax to the original pattern.

SUMMARY

In one embodiment, a method is provided for exporting design constraints from a circuit design. In response to a first user command indicating a design constraint and a pattern, the design constraint is assigned to each object in the circuit design that matches the pattern, and the pattern is stored in a database. In response to a second user command to export design constraints of the circuit design for each design constraint assigned to a respective set of objects of the circuit design, a pattern stored in the database that matches a set of the objects of the circuit design to which the design constraint is assigned is determined. In further response to the second user command, the design constraint is added to an export file in a format that uses the determined one of the stored patterns to indicate the set of objects to which the design constraint is assigned. In further response to the second user command, design constraints on individual ones of the set of the objects of the circuit design that are indicated by the determined one of the stored patterns are omitted from the export file.

In another embodiment, a method is provided for applying design constraints described at a location in a source file to a circuit design. Using a programmed processor, in response to a first user command indicating a design constraint to apply to one or more objects of a circuit design, located in a hierarchical level of the circuit design other than the top level, data is stored in a source-file mapping database that associates the design constraint with the source file and the location.

In another embodiment, a system for applying design constraints to a circuit design is provided, the system includes a memory and a programmed processor coupled to the memory. The programmed processor is configured to, in response to a first user command to apply a design constraint to objects of the circuit design matching a pattern, assign the design constraint to each object in the circuit design that matches the pattern. The programmed processor adds the pattern to a pattern database stored in the memory and adds data to a source-file mapping database stored in the memory that associates the design constraint with a source file and line number at which the constraint is described. In response to a second user command to export design constraints of the circuit design, for each design constraint assigned to a respective set of objects of the circuit design, the programmed processor determines a pattern in the pattern database that matches the set of the objects of the circuit design to which the design constraint is assigned. The programmed processor adds the design constraint to an export file in a format that uses the determined one of the stored patterns to indicate the set of objects to which the design constraint is assigned.

It will be appreciated that various other embodiments are set forth in the Detailed Description and Claims, which follow.

BRIEF DESCRIPTION OF THE DRAWINGS

Various aspects and advantages will become apparent upon review of the following detailed description and upon reference to the drawings, in which.

DETAILED DESCRIPTION

The disclosure describes methods and systems for importing and exporting of design constraints to and from a circuit design. As indicated above, several objects of a circuit design to which a design constraint is to be applied may be described as a pattern. When exporting design constraints, users generally prefer to see design constraints specified in a syntax (e.g., pattern) that is similar to the original input. However, it can be difficult to derive patterns for each set of objects of a circuit design when design constraints are exported from a circuit design. Moreover, patterns originally used to apply design constraints to objects may become invalid because design constraints may be modified during the synthesis and implementations flow—for example, by tcl commands, GUI interaction, or reading additional constraint files. In some of the disclosed methods and systems, patterns are stored for design constraints that are applied to a circuit design. When design constraints are exported, the stored patterns are used to identify patterns matching sets of objects of the circuit design and to generate compact user patterns.

Figure 1:
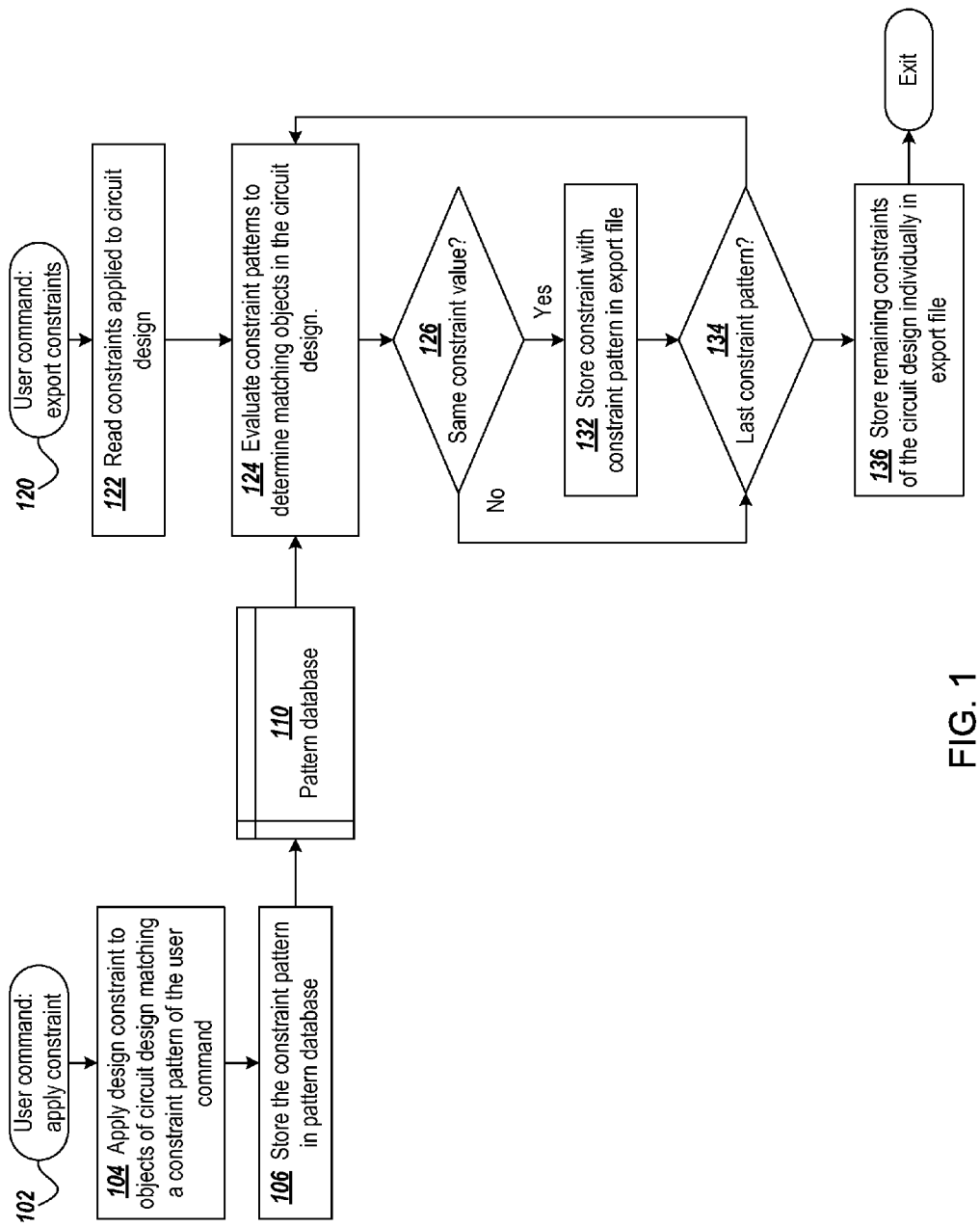
FIG. 1 shows a flowchart of a process for inputting exporting design constraints applied to and from a circuit design using patterns.

FIG. 1 shows a flowchart of a process for inputting and exporting design constraints to and from a circuit design using patterns. In response to a user command to apply a design constraint 102, the design constraint is applied to objects of a circuit design that match a pattern indicated by the user command at block 104. The pattern is stored in a pattern database 110 at block 106. In response to a user command 120 to export design constraints, design constraints applied to the circuit design are determined at block 122. At block 124, patterns in the pattern database 110 are evaluated to determine the matching objects in the design. For each pattern, the constraint name is stored (but not the constraint value). If the set of objects matching the pattern all have the same constraint value (a homogeneous constraint value) at decision block 126, a constraint using the pattern and the homogenous constraint value is added to the export file at block 132. This process is repeated for each stored constraint pattern. After the last constraint pattern has been evaluated, as indicated by decision step 134, design constraints applied to the circuit design that were not added to the export file at block 132 using a pattern are added to the export file individually at block 136.

The example process shown in FIG. 1 works well for a scenario in which each design constraint applied to objects and matching a pattern has the same constraint value. In this scenario, the pattern is used to generate a design constraint that applies to each matching object in the circuit design. As one example, the design constraint:

set_property dont_touch 1 [get_nets A/BP/*]

may be added to the export file if every object in the circuit design that matches the pattern A/B/* has a design constraint parameter dont_touch set to a constraint value of 1.

However, if different objects matching a pattern have different constraint values of design constraints, the exported constraints must be adjusted to accurately represent the constraint values of the design constraints applied to each object of the circuit design. For ease of reference, a pattern that matches a set of objects having different constraint values may be referred to as a heterogeneous pattern.

For heterogeneous patterns, a majority value is determined for the design constraint of the matching objects and a design constraint is added to the export file that has the heterogeneous pattern and the majority value. For objects of the circuit design that match the pattern and have different values of the design constraint, exception constraints are generated and saved to the export file. For example, objects matching a stored pattern A/B/* may have a design constraint parameter dont_touch set to different constraint values (e.g., 0 or 1). Ten objects matching the pattern may have a design constraint parameter dont_touch set to a value of 1 and two objects (e.g., A/B/F and A/B/F/Z) matching the pattern may have the design constraint dont_touch set to a value of 0. For this example scenario, a first design constraint,
  set_property dont_touch 1 [get_nets A/B/*]
having the pattern [get_nets A/B/*] and the majority constraint value (i.e., 1), is added to the export file. Two constraint exceptions:
  set_property dont_touch 0 [get_nets A/B/F], and
  set_property dont_touch 0 [get_nets A/B/F/Z]
are added to the export file for the objects that match the generic pattern but do not have the majority constraint value.

In some embodiments, further analysis may be performed to recognize patterns for subsets of the objects matching a heterogeneous pattern. For instance, in some implementations, analysis may be performed to determine a pattern for a subset in response to the number of exceptions exceeding a predetermined threshold. The analysis may determine an additional pattern that matches the subset of the objects, such that in combination, the additional pattern and the original heterogeneous pattern describe the constraints correctly and compactly. For instance, the exceptions for nets A/B/F/Z and A/B/F above may be represented in the export list as one exception:
  set_property dont_touch 0 [get_nets A/B/F*]

Figure 2:
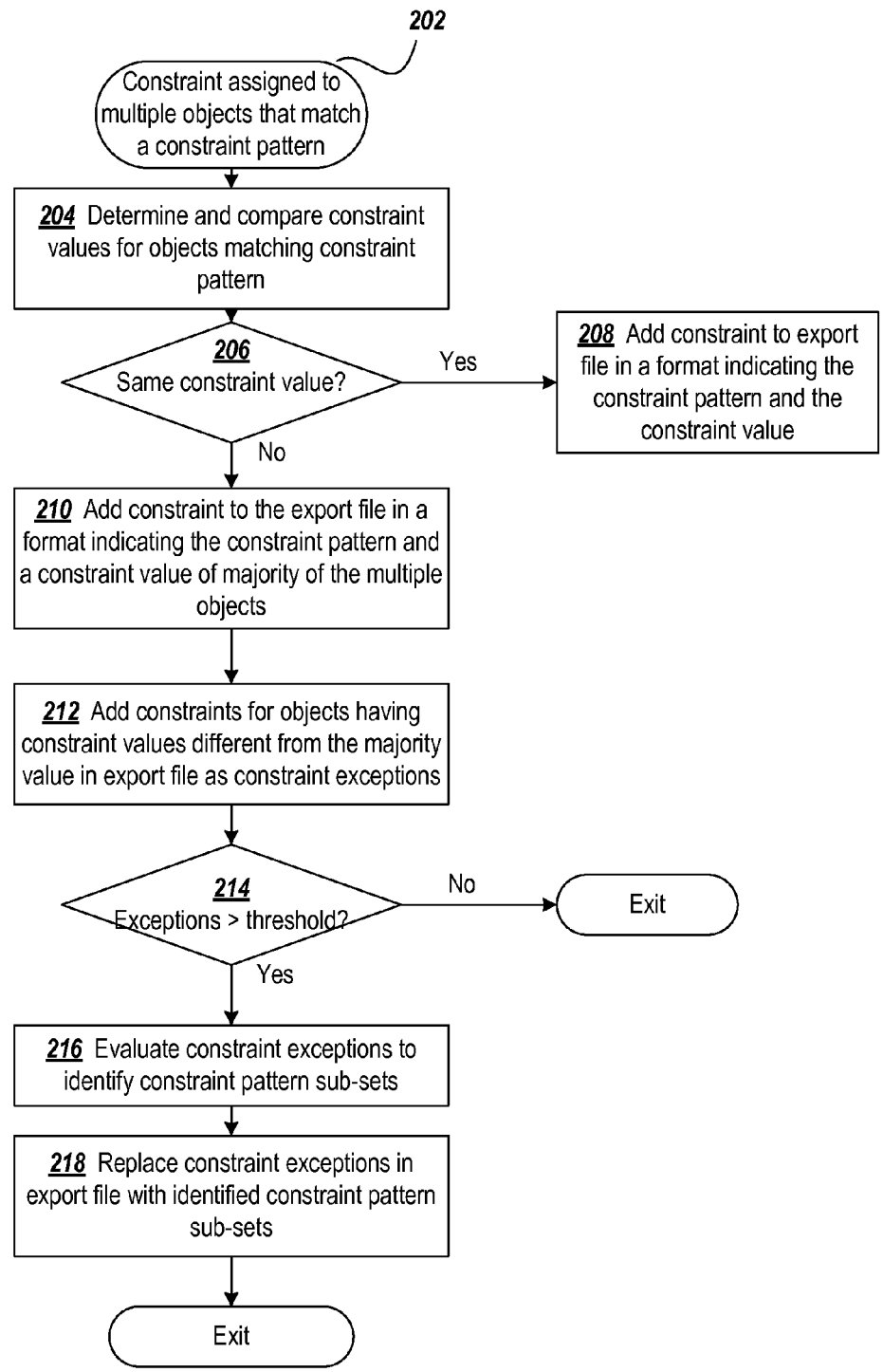
FIG. 2 shows a flowchart for exporting multiple design constraints.

FIG. 2 shows a flowchart for exporting a design constraint. In response to a design constraint 202, which is assigned to multiple objects that match a stored pattern, values of the design constraint are determined for each object matching the pattern and compared at block 204. If the design constraint has the same value for each of the objects at decision block 206, the design constraint is added to the export file value at block 208. The added design constraint is in a format that uses the pattern to indicate the set of objects to which the design constraint is assigned and that indicates the value. Otherwise, at block 210, a design pattern is added to the export file in a format that uses the determined pattern to indicate the set of objects to which the design constraint is assigned. The added constraint indicates a value of the design constraint for a majority of the objects to which the design constraint is assigned. For objects, in which the design constraint has a different constraint value from the majority constraint value, constraint exceptions are added to the export file at block 212. In this example, if the number of constraint exceptions for a design constraint are less than or equal to a predetermined threshold at decision block 214, the process exits. Otherwise, the constraint exceptions are evaluated to identify pattern sub-sets at block 216. Constraint exceptions stored in the export file that match the identified pattern are removed from the export file and a new constraint exception pattern is added to the export file at block 218. The new constraint exception is in a format that uses the identified pattern to indicate the set of objects to which the new constraint exception is assigned and indicates a value of the design constraint for corresponding objects.

As indicated above, design constraints may be applied to a circuit design that is to be incorporated as a sub-circuit cell in a larger top-level design. When the sub-circuit cell is incorporated, the design constraints previously applied to the circuit cell are also applied to instances of the cell in the top-level design. When cell-level constraints are added to the design, they are associated with a particular cell or group of cells at that time. For example, the command:
  read_xdc cell_1.xdc -cell A
associates design constraints in the constraint file cell_1.xdc with a particular cell instance (cell A). As another example, the command:
  read_xdc cell_1.xdc -ref ipcell
associates design constraints in cell_1.xdc with all cells that are instances of cell-reference "ipcell." These associations are maintained in a source-file mapping database.

If the same design constraint appears in several cell-level constraint files, a conflict may be created in the top-level design due to multiple design constraints having the same name. One or more embodiments automatically rename design constraints so that design constraints have unique names in the top-level design.

Figure 3:
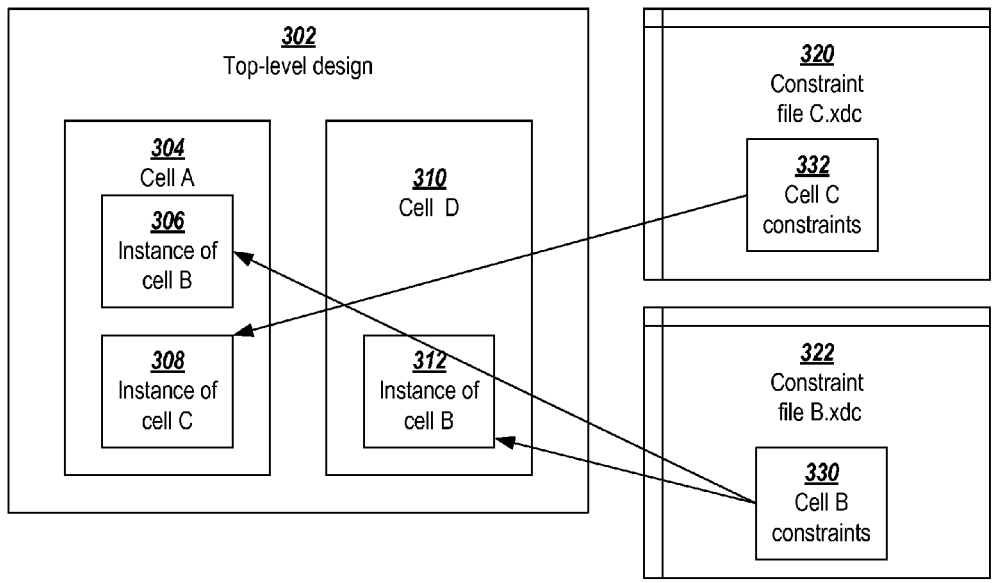
FIG. 3 illustrates a scenario in which cell-level design constraints may create conflicts in a top-level design.

FIG. 3 illustrates a scenario in which cell-level design constraints may create conflicts in a top-level design. In this example, the top-level design 302 includes sub-circuit cells A and D (304, 310). Cell A 304 includes an instance of cell B 306 and an instance of cell C 308 as sub-circuits. Cell D 310 also includes a respective instance of Cell B (312). Design constraint (332) for cell instance C of cell A 304 is provided by constraints source file C.xdc 320. Design constraint 330 for cell instances B 306 and 312 is provided by constraints source file B.xdc 322. Because both cell A and cell D include an instance of cell B 306 as a sub-circuit, the constraints source file B.xdc is applied to both instances. This can create a naming conflict in the top-level design when the design constraints are imported. For example, cell B design constraint file B.xdc 330 may include the design constraint:
  create pblock pblock_1.
Without renaming, importing the design constraint would attempt to create a first constraint pblock_1 for the instance uA/uB (subcell instance B of cell A) and a second constraint also called pblock_1 for instance uD/uB (subcell instance B of cell D). As a result, a conflict is created in the top-level design 302. In some implementations, design constraints applied to multiple cell instances are automatically renamed by adding prefixes that correspond to the cell instance associated with the design constraint. The addition of the prefix ensures that the respective design constraints have unique names in the top-level design. Referring to the above example, pblock_1 may be renamed to create a first constraint uA/uB_pblock_1 for instance uA/uB and a first constraint uD/uB_pblock_1 for instance uD/uB. Because the created constraints have unique names conflict can be avoided in the top-level design.

Figure 4:
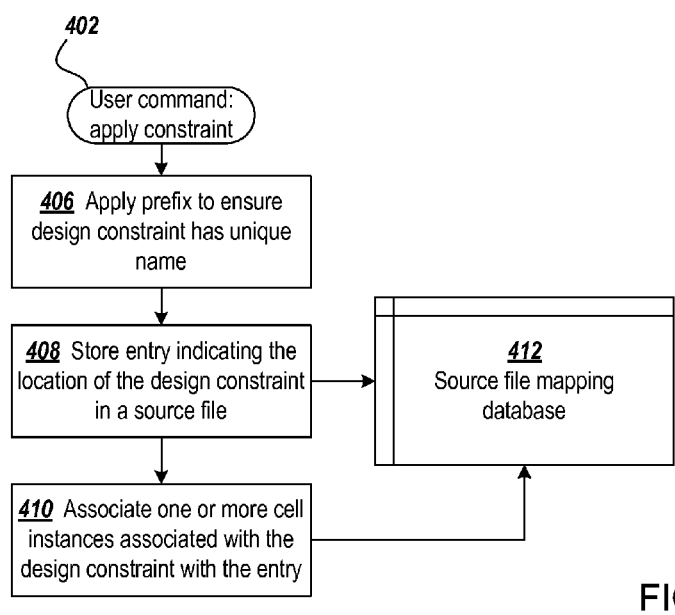
FIG. 4 shows a flowchart of a process for applying design constraints from a source file to objects in a circuit design in a manner that avoids conflicts in the top-level design.

FIG. 4 shows a flowchart of a process for applying design constraints from a source file to objects in a circuit design in a manner that avoids conflicts in the top-level design. In response to a user command 402 to apply a design constraint located in a source file to an object (e.g., cell instance) of the circuit design, at block 406 a prefix of a unique string of characters (corresponding to the object) is added to the name of the design constraint applied to the object to ensure that the design constraint has a unique name for each object. At block 408, an entry indicating the location of the design constraint (e.g., file path of the source file and line number of the design constraint in the source file) is stored in a source-file mapping database 412. Identifiers of the objects to which the design constraint is applied are associated with the entry at block 410. The association is stored and is later retrieved when placement and routing is performed.

During development of a circuit design, design constraints may be modified to address various issues. For example, timing or placement of various components of a circuit design may need to be adjusted to accommodate an additional component that is to be added. To facilitate debugging and development, some of the disclosed systems may include a mechanism to save checkpoints. Each checkpoint indicates design constraints applied to a circuit design at the time the checkpoint was saved. A checkpoint may be used to restore design constraints to an earlier configuration. For instance, the checkpoint may indicate a source-file file path and line number for each design constraint. However, due to long file names and file path of the source files, the database of checkpoints may become prohibitively large.

A source-file mapping database may be maintained to indicate the source file and line numbers of each design constraint and objects to which the design constraint is assigned. Checkpoints are stored in a checkpoint database in which each checkpoint indicates entries in the source-file mapping database corresponding to design constraints that are applied to the circuit design at a time indicated by the checkpoint. Within the checkpoint database, many constraints may refer to the same entry with a long file path. Because long file paths of the design constraints are not included with each constraint stored in the checkpoint, memory requirements and processing time to save and restore checkpoints are reduced. An example of information that may be stored in the source-file mapping database and the checkpoint database is provided below.

Figure 5:
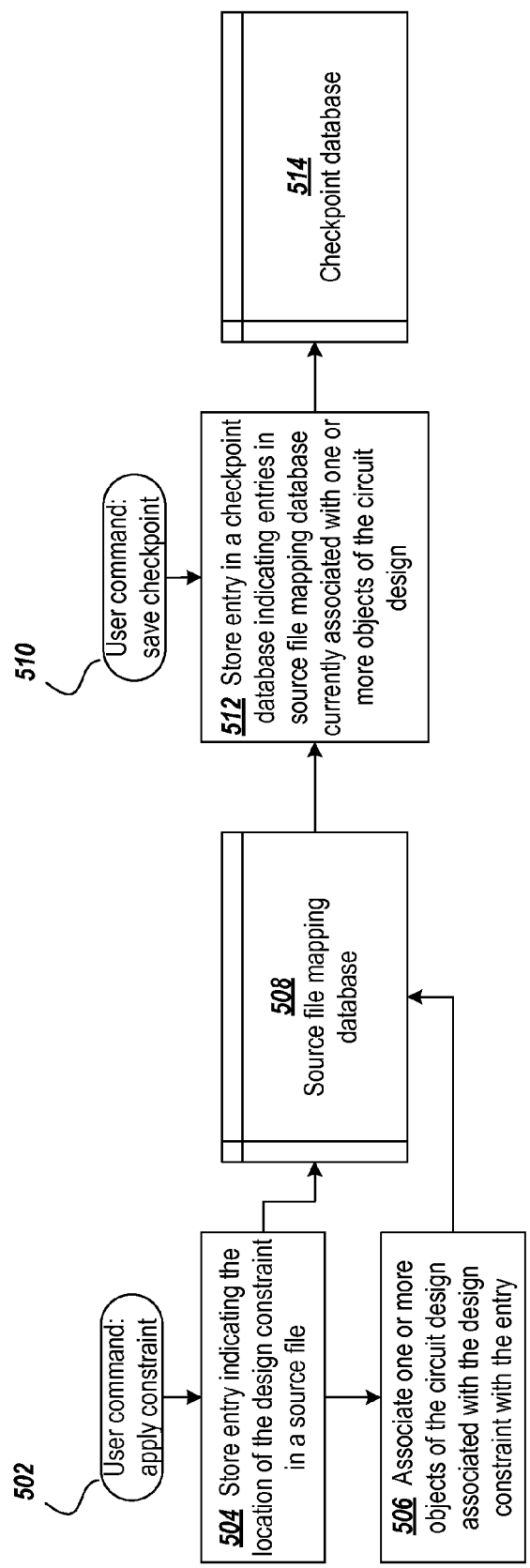
FIG. 5 shows a flowchart for tracking design constraints.

FIG. 5 shows a flowchart of a process for tracking design constraints. In response to a user command 502 in a source file to apply a design constraint to one or more objects of a circuit design, an entry indicating the location (e.g., line number) of the command containing the design constraint in the source file is stored at block 504 in a source-file mapping database 508. One or more objects of the circuit design to which the design constraint is applied, are associated with the entry at block 506. For example, names of the objects are associated with the location of the command. In response to a user command 510 to save a checkpoint indicating design constraints currently applied to a circuit design, an entry is stored in a checkpoint database 514 at block 512. The entry in the checkpoint database indicates entries in the source-file mapping database 508 that are currently associated with one or more objects of the circuit design.

As an example, a source file place.xdc contains 64 design constraints:
    set_property LOC A35 [get_ports addr[0]]
    set_property LOC A41 [get_ports addr[1]]
    . . .
    set_property LOC J23 [get_ports addr[63]]
and may be saved on a Linux machine at file path:
    /home/usr1/bobsmith/projects/cpu/versions/5.6.1/
        sources/io_placement/io_place.xdc.
If the full file path were to be stored for each design constraint in the checkpoint, the checkpoint would include 64 entries, such as:
    set_property LOC A35 [get_ports addr[0]
    ←home/usr1/bobsmith/projects/cpu/versions/5.6.1/
        sources/io_placement/io_place.xdc
    set_property LOC A41 [get_ports addr[1]
    ←/home/usr1/bobsmith/projects/cpu/versions/5.6.1/
        sources/io_placement/io_place.xdc
    . . .
    set_property LOC J23 [get_ports addr[63]
    ←/home/usr1/bobsmith/projects/cpu/versions/5.6.1/
        sources/io_placement/io_place.xdc
By storing the file path in a source-file mapping database, as discussed with reference to FIG. 4, the repeated strings indicating the file path to source file place.xdc can be omitted in the checkpoint entries. For instance, the source-file mapping database 508 may include an entry:
    file17 ../../sources/io_placement/io_place.xdc
In this example, the entry maps the file path to a pointer (file 17), which indicating a memory location of the file path in the source-file mapping database 508. The checkpoint entry stored in the checkpoint database 514 may indicate the sixty-four design constraints as:
    set_property LOC A35 [get_ports addr[0]←file17
    set_property LOC A41 [get_ports addr[1]←file17
    . . .
    set_property LOC J23 [get_ports addr[63]←file17
As a result, less memory is required to store each checkpoint in the database 514.

This approach also helps to facilitate portability of the checkpoints between computing platforms that use different directory file paths. For instance, the source file place.xdc may be stored on a Linux system at file path
    /home/usr1/bobsmith/projects/cpu/versions/5.6.1/
        sources/io_placement/io_place.xdc.
But stored on a windows machine at file path
    H:/drives/homedirs/bobsmith/projects/cpu/versions/5.6.1/
        sources/io_placement/io_place.xdc
Because the file path is stored in one location in source-file mapping database 508, the file path can be more easily adjusted to port design constraints between different computing platforms.

Figure 6:
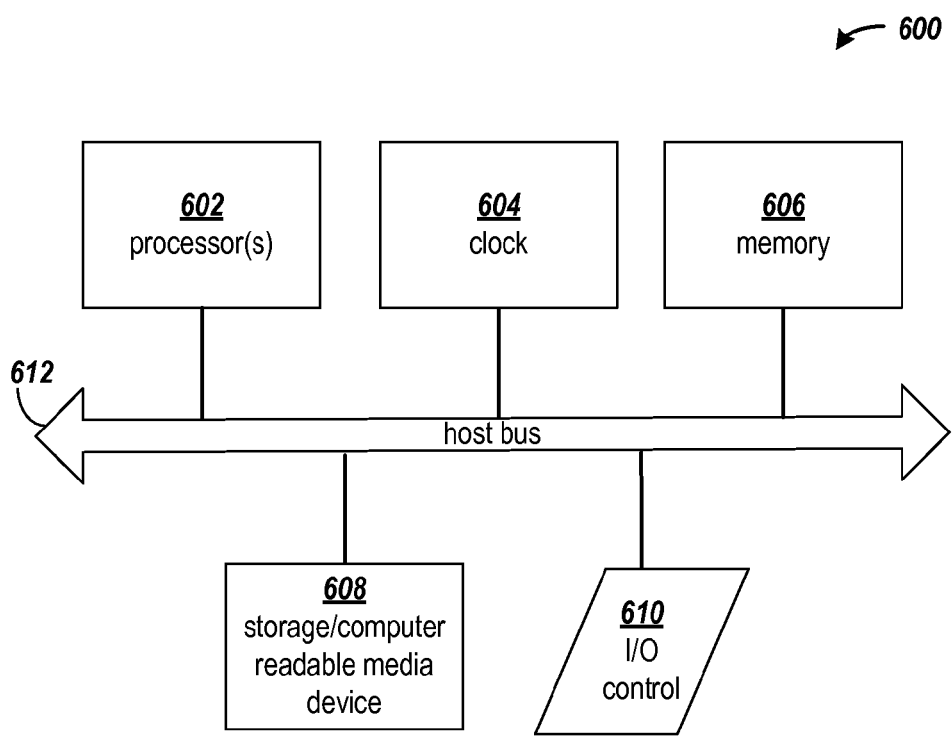
FIG. 6 shows a block diagram of an example computing arrangement that may be configured to implement the processes described herein.

FIG. 6 shows a block diagram of an example computing arrangement that may be configured to implement the processes described herein. It will be appreciated that various alternative computing arrangements, including one or more processors and a memory arrangement configured with program code, would be suitable for hosting the disclosed processes and data structures. The computer code, which implements the disclosed processes, is encoded in a processor executable format and may be stored and provided via a variety of computer-readable storage media or delivery channels such as magnetic or optical disks or tapes, electronic storage devices, or as application services over a network.

Processor computing arrangement 600 includes one or more processors 602, a clock signal generator 604, a memory arrangement 606, a storage arrangement 608, and an input/output control unit 610, all coupled to a host bus 612. The arrangement 600 may be implemented with separate components on a circuit board or may be implemented internally within an integrated circuit. When implemented internally within an integrated circuit, the processor computing arrangement is otherwise known as a microcontroller.

The architecture of the computing arrangement depends on implementation requirements as would be recognized by those skilled in the art. The processor(s) 602 may be one or more general purpose processors, or a combination of one or more general purpose processors and suitable co-processors, or one or more specialized processors (e.g., RISC, CISC, pipelined, etc.).

The memory arrangement 606 typically includes multiple levels of cache memory, and a main memory. The storage arrangement 608 may include local and/or remote persistent storage, such as provided by magnetic disks (not shown), flash, EPROM, or other non-volatile data storage. The storage arrangement may be read or read/write capable. Further, the memory arrangement 606 and storage arrangement 608 may be combined in a single arrangement.

The processor(s) 602 executes the software in storage arrangement 608 and/or memory arrangement 606, reads data from and stores data to the storage arrangement 608 and/or memory arrangement 606, and communicates with external devices through the input/output control arrangement 610. These functions are synchronized by the clock signal generator 604. The resources of the computing arrangement may be managed by either an operating system (not shown), or a hardware control unit (not shown).

The embodiments may be applicable to a variety of HDL circuit design tools. Other aspects and embodiments will be apparent from consideration of the specification. It is intended that the specification and illustrated embodiments be considered as examples only, with a true scope and spirit of the embodiments being indicated by the following claims.

What is claimed is:

1. A method for exporting design constraints from a circuit design, comprising:
on a programmed processor, performing operations including:
in response to a first user command indicating a design constraint and a pattern:
assigning the design constraint to each object in the circuit design that matches the pattern; and
storing the pattern in a database; and
in response to a second user command to export design constraints of the circuit design, for each design constraint assigned to a respective set of objects of the circuit design:
determining a pattern stored in the database that matches the set of the objects of the circuit design to which the design constraint is assigned; and
adding the design constraint to an export file in a format that uses the determined one of the stored patterns to indicate the set of objects to which the design constraint is assigned.

2. The method of claim 1, wherein:
the adding of the design constraint to the export file includes:
comparing values of design constraints for the set of the objects of the circuit design to which the design constraint is assigned; and
in response to the set of the objects having different values for the design constraint:
determining a majority value of a majority of the design constraint for the set of the objects of the circuit design;
adding the design constraint to the export file in a format that uses the determined one of the stored patterns to indicate the set of objects to which the design constraint is assigned and the majority value;
generating a set of constraint exceptions for ones of the set of the objects of the circuit design having constraint values for the design constraint that are different from the majority value; and
adding the set of constraint exceptions to the export file.

3. The method of claim 2, wherein the adding of the design constraint to the export file further includes:
identifying a pattern subset that matches the ones of the set of the objects of the circuit design having constraint values for the design constraint that are different from the majority value; and
in response to identifying the pattern subset, replacing ones of the set of constraint exceptions corresponding to the ones of the set of the objects of the circuit design having constraint values for the design constraint that are different from the majority value with a single constraint exception having the pattern subset.

4. The method of claim 3, wherein the identifying of pattern subsets is performed in response to a number of the constraint exceptions exceeding a threshold.

5. A method for applying design constraints to a circuit design, comprising:
on a programmed processor, performing operations including:
in response to a first user command indicating a design constraint and a pattern:
applying the design constraint to one or more objects that match the pattern in a circuit design located in a hierarchical level of the circuit design other than a top level;
storing data in a source-file mapping database that associates the design constraint with a source file and a location;
wherein the design constraint is described at the location in the source file; and
storing the pattern in a database;
in response to a second user command to export design constraints of the circuit design, for each design constraint assigned to a respective set of objects of the circuit design:
determining a pattern stored in the database that matches the set of the objects of the circuit design to which the design constraint is assigned; and
adding the design constraint to an export file in a format that uses the determined one of the stored patterns to indicate the set of objects to which the design constraint is assigned.

6. The method of claim 5, wherein the storing of data that associates the design constraint with the source file and the location includes:
storing an entry in the source-file mapping database indicating a file path of the source file and a location of the design constraint in the source file.

7. The method of claim 6, wherein the storing of data that associates the design constraint with the source file and the location further includes:
renaming the design constraints to have unique names.

8. The method of claim 7, wherein the renaming the design constraints to have unique names includes adding a unique prefix to each of the design constraints.

9. The method of claim 5, wherein the location indicates a line number in the source file.

10. The method of claim 6, wherein the operations further comprise, in response to a third user command requesting a first checkpoint be saved:
storing an entry in a checkpoint database indicating respective source files and line numbers in the source files where design constraints applied to objects of the circuit design are located.

11. The method of claim 10, wherein the entry in the checkpoint database includes pointers to entries in the source-file mapping database corresponding to the design constraints assigned to objects of the circuit design.

12. The method of claim 11, wherein, for a design constraint assigned to multiple objects in the circuit design, the source file and line number in the source file at which the design constraint is located is represented by a single entry in the source-file mapping database.

13. The method of claim 10, wherein the operations further comprise, in response to a fourth user command requesting the first checkpoint be restored:
retrieving an entry that corresponds to the first checkpoint from the checkpoint database;
determining a set of design constraints in the source-file mapping database that corresponds to the first checkpoint; and
applying the set of design constraints to respective objects of the circuit design indicated by each design constraint in the set.

14. The method of claim 13, wherein:
the storing of the entry in the checkpoint database is performed on a first computing platform; and
the retrieving of the entry from the checkpoint database is performed on a second computing platform, the second computing platform utilizing a file path different from a file path utilized by the first computing platform.

15. A system for applying design constraints to a circuit design, comprising:
a processor;
a memory coupled to the processor and configured with instructions that cause the processor to perform operations including:
in response to a first user command to apply a design constraint, described at a location in a source file, to objects of the circuit design matching a pattern:
assigning the design constraint to each object in the circuit design that matches the pattern;
adding the pattern to a pattern database stored in the memory; and
adding data to a source-file mapping database stored in the memory that associates the design constraint with the source file and the location; and
in response to a second user command to export design constraints of the circuit design, for each design constraint assigned to a respective set of objects of the circuit design:
determining a pattern in the pattern database that matches the set of the objects of the circuit design to which the design constraint is assigned;
adding the design constraint to an export file in a format that uses the determined one of the stored patterns to indicate the set of objects to which the design constraint is assigned.

16. The system of claim 15, wherein the operations further include:
in response to a second user command requesting a first checkpoint be saved, for each design constraint assigned to a respective set of objects of the circuit design:
determining a pattern in the pattern database that matches the respective set of the objects of the circuit design to which the design constraint is assigned; and
adding the design constraint to a checkpoint database stored in the memory in a format that uses the determined one of the stored patterns to indicate the set of objects to which the design constraint is assigned and includes a pointer to an entry in the source-file mapping database indicating the source file and line number locations of the design constraint applied to the set of objects of the circuit design.

17. The system of claim 16, wherein the operations further include, in response to a third user command requesting the first checkpoint be restored:
retrieving an entry from the checkpoint database that corresponds to the first checkpoint;
determining a set of design constraints in the source-file mapping database that corresponds to the first checkpoint; and
applying the set of design constraints to respective objects of the circuit design indicated by each design constraint in the set.

18. The system of claim 16, wherein the operations further include adding a single entry to the source-file mapping database for a design constraint assigned to multiple objects in the circuit design.

19. The system of claim 15, wherein the operations further include renaming the design constraints to have unique names prior to the adding data that associates the design constraint with the source file and the location to the source-file mapping database.

20. The system of claim 19, wherein the operations further include renaming the design constraints to have unique names by adding a unique prefix to each of the design constraints.

* * * * *